US 12,085,951 B2

(12) United States Patent
Eoh et al.

(10) Patent No.: US 12,085,951 B2
(45) Date of Patent: Sep. 10, 2024

(54) METHOD OF UPDATING MAP IN FUSION SLAM AND ROBOT IMPLEMENTING SAME

(71) Applicant: LG ELECTRONICS INC., Seoul (KR)

(72) Inventors: Gyuho Eoh, Seoul (KR); Jungsik Kim, Seoul (KR); Hyoungrock Kim, Seoul (KR); Dong Ki Noh, Seoul (KR); Joongtae Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 969 days.

(21) Appl. No.: 16/964,982

(22) PCT Filed: Jun. 14, 2019

(86) PCT No.: PCT/KR2019/007227
§ 371 (c)(1),
(2) Date: Jul. 25, 2020

(87) PCT Pub. No.: WO2020/251100
PCT Pub. Date: Dec. 17, 2020

(65) Prior Publication Data
US 2023/0161356 A1    May 25, 2023

(51) Int. Cl.
*G05D 1/00* (2024.01)
*G01S 17/89* (2020.01)
(Continued)

(52) U.S. Cl.
CPC ............ *G05D 1/0274* (2013.01); *G01S 17/89* (2013.01); *G05D 1/0212* (2013.01);
(Continued)

(58) Field of Classification Search
CPC .. G05D 1/0274; G05D 1/0212; G05D 1/0248; G05D 1/024; G05D 1/0238;
(Continued)

(56) References Cited

U.S. PATENT DOCUMENTS 8,818,722 B2 *  8/2014  Elgersma .................. G06T 7/74
                                                              701/28
10,437,252 B1 * 10/2019  Liu ...................... G01C 21/3878
(Continued)

FOREIGN PATENT DOCUMENTS

JP         6487010         4/2018
KR       20090109830      10/2009
(Continued)

OTHER PUBLICATIONS

Annotated English copy of WO 2018162646 (Year: 2018).*
(Continued)

*Primary Examiner* — Russell Frejd
*Assistant Examiner* — Brandon Z Willis
(74) *Attorney, Agent, or Firm* — LEE, HONG, DEGERMAN, KANG & WAIMEY

(57) ABSTRACT

Disclosed herein are a method of updating a map in fusion SLAM and a robot implementing the same, the robot, which updates a map in fusion SLAM using two types of sensors, configured to update a first map with first type information acquired by a first sensor and to estimate a current position of the robot using second type information acquired by a second sensor.

20 Claims, 14 Drawing Sheets

(51) Int. Cl.
*G06F 30/13* (2020.01)
*G06T 7/579* (2017.01)

(52) U.S. Cl.
CPC .......... *G05D 1/0248* (2013.01); *G06F 30/13* (2020.01); *G06T 7/579* (2017.01)

(58) Field of Classification Search
CPC .............. G05D 1/0246; G05D 1/0272; G05D 2201/0207; G01S 17/89; G01S 17/931; G01S 17/86; G06F 30/13; G06T 7/579; G06T 7/70; G06T 1/0007; G06T 1/0014; G06T 2210/04; B25J 9/16; B25J 9/1679; B25J 11/00; B25J 11/008; B25J 13/08; B25J 13/088; B25J 13/089; B25J 19/02; B25J 19/021; B25J 19/022; B25J 19/023; B60W 2420/52; B60W 2420/403; B60W 2420/42
See application file for complete search history.

(56) References Cited

U.S. PATENT DOCUMENTS

| | | | | |
|---|---|---|---|---|
| 10,989,542 | B2 * | 4/2021 | Zhang | ................ G01C 21/3804 |
| 2005/0182518 | A1 | 8/2005 | Karlsson | |
| 2005/0234679 | A1 | 10/2005 | Karlsson | |
| 2014/0350839 | A1 | 11/2014 | Pack et al. | |
| 2015/0212521 | A1 | 7/2015 | Pack et al. | |
| 2016/0209846 | A1 | 7/2016 | Eustice et al. | |
| 2018/0075643 | A1 | 3/2018 | Sequeira et al. | |
| 2018/0149753 | A1 | 5/2018 | Shin et al. | |
| 2019/0329407 | A1 * | 10/2019 | Qi | ........................ G05D 1/0248 |
| 2022/0137638 | A1 * | 5/2022 | Tomono | .................. G01S 17/89 701/25 |
| 2022/0244072 | A1 * | 8/2022 | Slatcher | ............. G01C 21/3848 |

FOREIGN PATENT DOCUMENTS

| | | |
|---|---|---|
| KR | 101439921 | 1/2014 |
| KR | 1020180004151 | 1/2018 |
| KR | 20180109455 | 10/2018 |
| KR | 20180135755 | 12/2018 |
| KR | 20190045006 | 5/2019 |
| WO | WO-2018162646 A1 * | 9/2018 |

OTHER PUBLICATIONS

PCT International Application No. PCT/KR2019/007227, International Searching Authority dated Mar. 12, 2020, 3 pages.
Korean Intellectual Property Office Application Serial No. 10-2019-7026554, Notice of Allowance dated Jan. 27, 2021, 5 pages.

* cited by examiner

METHOD OF UPDATING MAP IN FUSION SLAM AND ROBOT IMPLEMENTING SAME

CROSS-REFERENCE TO RELATED APPLICATIONS

This application is the National Stage filing under 35 U.S.C. 371 of International Application No. PCT/KR2019/007227, filed on Jun. 14, 2019, the contents of which are all hereby incorporated by reference herein in their entirety.

TECHNICAL FIELD

The present disclosure relates to a method of updating a map in fusion SLAM and a robot implementing the same.

BACKGROUND

A large-scale retail store, a department store, an airport, a golf course, and the like are places where exchange of goods and services takes place between people. Robots may be useful in the places to offer information or convenience to people.

Robots may be classified as guide robots, security robots, cleaning robots and the like. The robots move in a space, confirming their positions.

The robots are required to hold information on a space, on their current positions, or on a path previously moved by the robots and the like such that the robots move confirming their positions and avoiding obstacles.

The robots may store maps to confirm a space and to move in the space. To generate a map, the robots may draw up a map using a variety of sensors, and may match and store various pieces of information in the map.

In case a robot uses a plurality of sensors, accuracy may be enhanced in updating a map. Additionally, to enhance accuracy, information sensed by a sensor needs to be verified or its accuracy needs to be determined.

Accordingly, in this specification, a method of updating a map using multi sensors is described.

DISCLOSURE

Technical Problems

According to the present disclosure as a means to achieve the above-described objectives, a robot estimates its position on the basis of various types of sensors and updates a map with information acquired by each sensor on the basis of the estimated position, to enhance accuracy of the map.

According to the present disclosure, pieces of information stored in a primary map is maintained while a position of a robot is calculated and updated on the basis of information generated by each sensor, to maintain an agreement between data of maps.

According to the present disclosure, some of the data acquired by each sensor of a robot during fusion SLAM are used for localization and the other data are used to update a map such that the process of localization and the process of updating a map are simultaneously carried out.

Objectives of the present disclosure are not limited to what has been described. Additionally, other objectives and advantages that have not been mentioned may be clearly understood from the following description and may be more clearly understood from embodiments. Further, it will be understood that the objectives and advantages of the present disclosure may be realized via means and a combination thereof that are described in the appended claims.

Technical Solutions

While a robot that updates a map in fusion SLAM, according to an embodiment, uses two types of sensors, first type information acquired by a first sensor is used to update a first map, and second type information acquired by a second sensor is used to estimate a current position of the robot.

For the robot, the first sensor is a LiDAR sensor and the second sensor is a camera sensor, a map storage stores a visual map that is a second map, and a controller loads the visual map to estimate a position of the robot and adds information sensed by the LiDAR sensor to the first map with respect to the estimated position.

For the robot, the first sensor is a camera sensor and the second sensor is a LIDAR sensor, the map storage stores a LiDAR map that is the second map, and the controller loads the LiDAR map to estimate a position of the robot and adds information sensed by the camera sensor to the first map with respect to the estimated position.

A method of updating a map in fusion SLAM according to an embodiment includes acquiring first type information by a first sensor of a robot, acquiring second type information by a second sensor of the robot, estimating a current position of the robot by a controller of the robot using a second map of a second type stored in a map storage, and updating a first map with the first type information with respect to the estimated position and storing the same in the map storage by the controller.

Advantageous Effects

According to embodiments of the present disclosure, a robot may estimate its position on the basis of various types of sensors and may update a map using information acquired by each sensor on the basis of the estimated position, thereby making it possible to improve accuracy of the map.

According to the embodiments, pieces of information stored in primary maps are maintained while a position of the robot is calculated and updated on the basis of information generated by each sensor, thereby making it possible to maintain an alignment between pieces of information of the maps.

According to the embodiments, some pieces of information acquired by each sensor of the robot during fusion SLAM are applied to localization and the other pieces of information are applied to updating the map, thereby making it possible to simultaneously performing localization and update of the map.

Effects of the present disclosure are not limited to the above-described ones, and one having ordinary skill in the art to which the disclosure pertains may easily draw various effects from the configuration of the disclosure.

DETAILED DESCRIPTIONS

Figure 1:
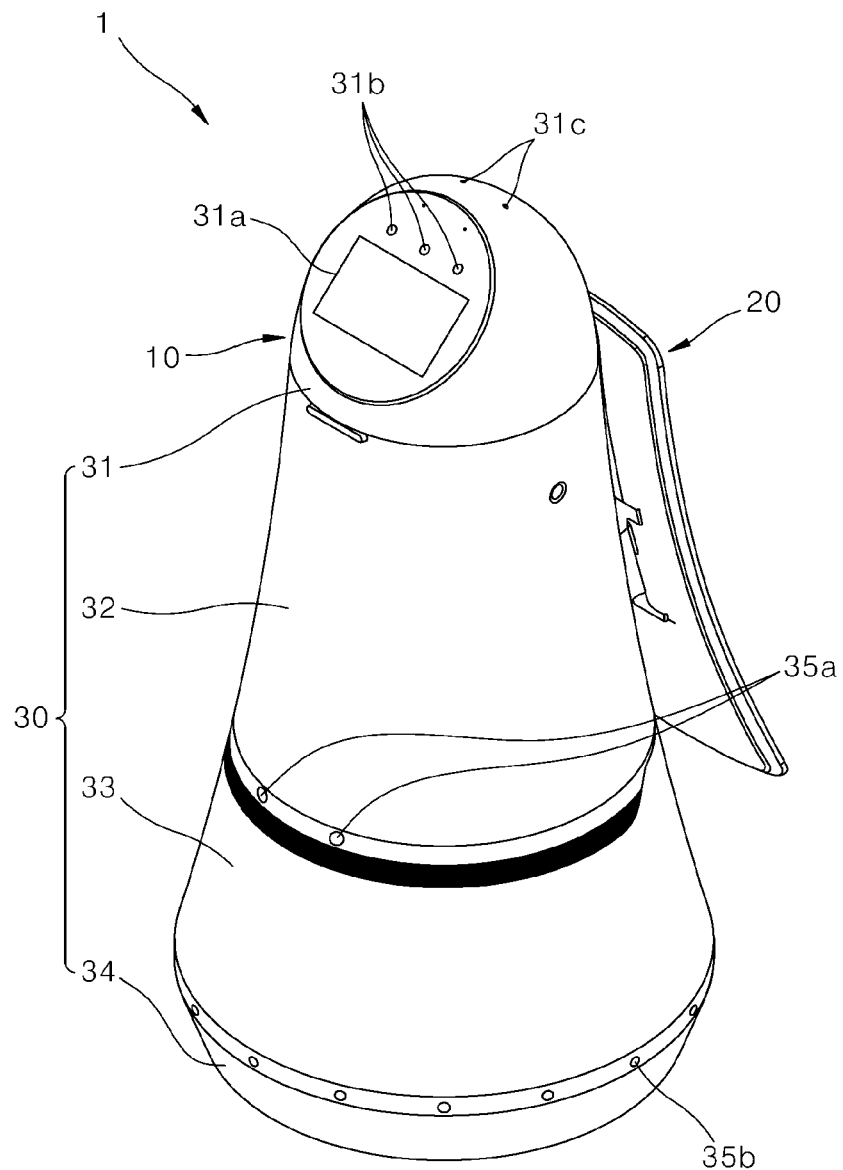
FIG. 1 shows an appearance of a robot according to an embodiment.

Hereinafter, embodiments of the present disclosure will be described in detail with reference to the drawings so that those skilled in the art to which the present disclosure pertains can easily implement the present disclosure. The present disclosure may be implemented in many different manners and is not limited to the embodiments described herein.

In order to clearly illustrate the present disclosure, technical explanation that is not directly related to the present disclosure may be omitted, and same or similar components are denoted by a same reference numeral throughout the specification. Further, some embodiments of the present disclosure will be described in detail with reference to the drawings. In adding reference numerals to components of each drawing, the same components may have the same reference numeral as possible even if they are displayed on different drawings. Further, in describing the present disclosure, a detailed description of related known configurations and functions will be omitted when it is determined that it may obscure the gist of the present disclosure.

In describing components of the present disclosure, it is possible to use the terms such as first, second, A, B, (a), (b), and the like. These terms are only intended to distinguish a component from another component, and a nature, an order, a sequence, or the number of the corresponding components is not limited by that term. When a component is described as being "connected," "coupled" or "connected" to another component, the component may be directly connected or able to be connected to the other component; however, it is also to be understood that an additional component may be "interposed" between the two components, or the two components may be "connected," "coupled" or "connected" through an additional component.

Further, with respect to embodiments of the present disclosure, for convenience of explanation, the present disclosure may be described by subdividing an individual component, but the components of the present disclosure may be implemented within a device or a module, or a component of the present disclosure may be implemented by being divided into a plurality of devices or modules.

In this specification, a robot includes devices that are used for specific purposes (cleaning, ensuring security, monitoring, guiding and the like) or that moves offering functions according to features of a space in which the robot is moving, hereunder. Accordingly, in this specification, devices that have transportation means capable of moving using predetermined information and sensors, and that offer predetermined functions are generally referred to as a robot.

In this specification, a robot may move with a map stored in it. The map denotes information on fixed objects such as fixed walls, fixed stairs and the like that do not move in a space. Additionally, information on movable obstacles that are disposed periodically, i.e., information on dynamic objects may be stored on the map.

As an example, information on obstacles disposed within a certain range with respect to a direction in which the robot moves forward may also be stored in the map. In this case, unlike the map in which the above-described fixed objects are stored, the map includes information on obstacles, which is registered temporarily, and then removes the information after the robot moves.

Further, in this specification, the robot may confirm an external dynamic object using various sensors. When the robot moves to a destination in an environment that is crowded with a large number of pedestrians after confirming the external dynamic object, the robot may confirm a state in which waypoints to the destination are occupied by obstacles.

Furthermore, the robot may determine the robot arrives at a waypoint on the basis of a degree in a change of directions of the waypoint, and the robot moves to the next waypoint and the robot can move to destination successfully.

FIG. 1 shows an appearance of a robot according to an embodiment. FIG. 1 shows an exemplary appearance. The robot may be implemented as robots having various appearances in addition to the appearance of FIG. 1. Specifically, each component may be disposed in different positions in the upward, downward, leftward and rightward directions on the basis of the shape of a robot.

A main body 10 may be configured to be long in the up-down direction, and may have the shape of a roly poly toy that gradually becomes slimmer from the lower portion toward the upper portion, as a whole.

The main body 10 may include a case 30 that forms the appearance of the robot 1. The case 30 may include a top cover 31 disposed on the upper side, a first middle cover 32 disposed on the lower side of the top cover 31, a second middle cover 33 disposed on the lower side of the first middle cover 32, and a bottom cover 34 disposed on the lower side of the second middle cover 33. The first middle cover 32 and the second middle cover 33 may constitute a single middle cover.

The top cover 31 may be disposed at the uppermost end of the robot 1, and may have the shape of a hemisphere or a dome. The top cover 31 may be disposed at a height below the average height for adults to readily receive an instruction from a user. Additionally, the top cover 31 may be configured to rotate at a predetermined angle.

The robot 1 may further include a control module 150 therein. The control module 150 controls the robot 1 like a type of computer or a type of processor. Accordingly, the control module 150 may be disposed in the robot 1, may perform functions similar to those of a main processor, and may interact with a user.

The control module 150 is disposed in the robot 1 to control the robot during the robot's movement by sensing objects around the robot. The control module 150 of the robot may be implemented as a software module, a chip in which a software module is implemented as hardware, and the like.

A display unit 31a that receives an instruction from a user or that outputs information, and sensors, for example, a camera 31b and a microphone 31c may be disposed on one side of the front surface of the top cover 31.

In addition to the display unit 31a of the top cover 31, a display unit 20 is also disposed on one side of the middle cover 32.

Information may be output by all the two display units 31a, 20 or may be output by any one of the two display units 31a, 20 according to functions of the robot.

Additionally, various obstacle sensors (220 in FIG. 2) are disposed on one lateral surface or in the entire lower end portion of the robot 1 like 35a, 35b. As an example, the obstacle sensors include a time-of-flight (TOF) sensor, an ultrasonic sensor, an infrared sensor, a depth sensor, a laser sensor, and a LiDAR sensor and the like. The sensors sense an obstacle outside of the robot 1 in various ways.

Additionally, the robot in FIG. 1 further includes a moving unit that is a component moving the robot in the lower end portion of the robot. The moving unit is a component that moves the robot, like wheels.

The shape of the robot in FIG. 1 is provided as an example. The present disclosure is not limited to the example. Additionally, various cameras and sensors of the robot may also be disposed in various portions of the robot 1. As an example, the robot of FIG. 1 may be a guide robot that gives information to a user and moves to a specific spot to guide a user.

The Robot in FIG. 1 may also include a robot that offers cleaning services, security services or functions. The robot may perform a variety of functions. However, in this specification, the focus is on a guide robot for convenience of description.

In a state in which a plurality of the robots in FIG. 1 are disposed in a service space, the robots perform specific functions (guide services, cleaning services, security services and the like). In the process, the robot 1 may store information on its position, may confirm its current position in the entire space, and may generate a path required for moving to a destination.

Figure 2:
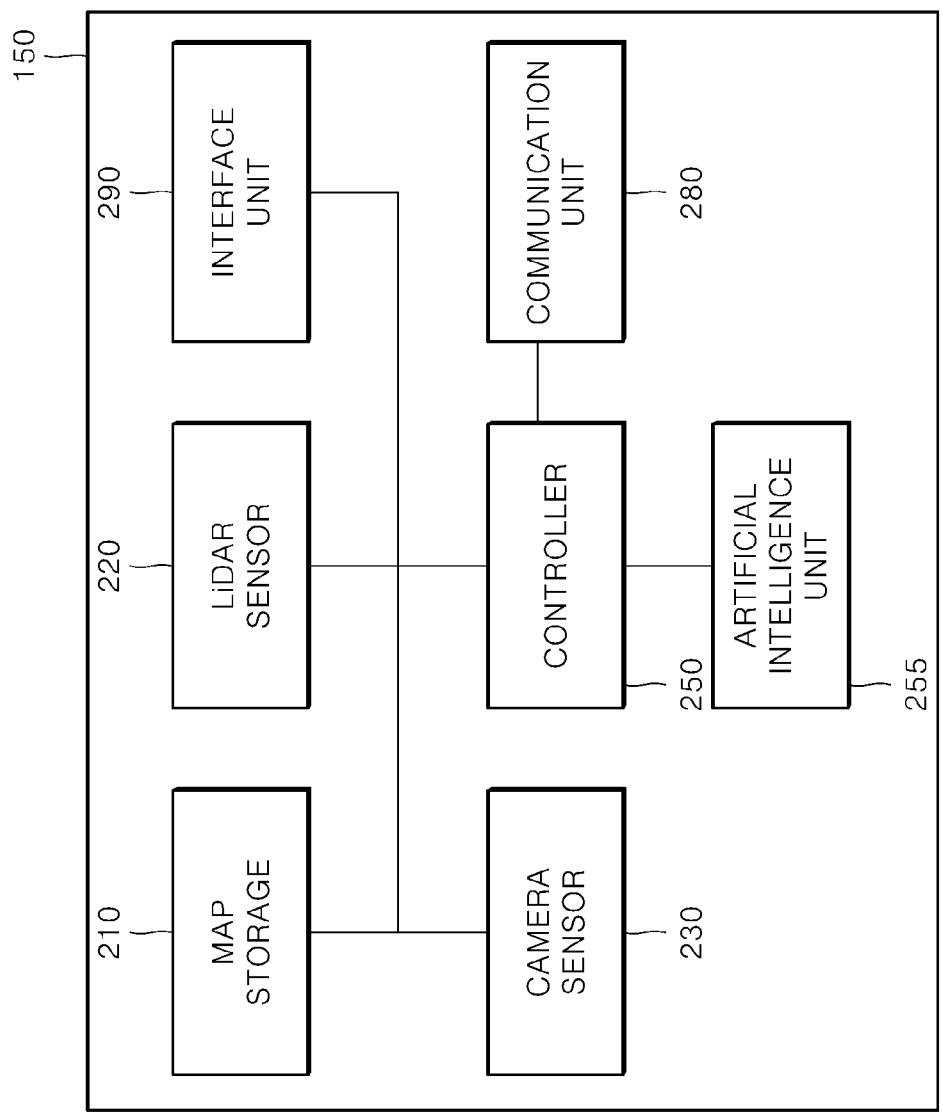
FIG. 2 shows components of a control module of a robot according to an embodiment.

FIG. 2 shows components of a control module of a robot according to an embodiment.

The robot may perform both of the functions of generating a map and estimating a position of the robot using the map.

Alternately, the robot may only offer the function of generating a map.

Alternately, the robot may only offer the function of estimating a position of the robot using the map. Below, the robot of the present disclosure usually offers the function of estimating a position of the robot using the map. Additionally, the robot may offer the function of generating a map or modifying a map.

A LIDAR sensor 220 may sense surrounding objects two-dimensionally or three-dimensionally. A two-dimensional LiDAR sensor may sense positions of objects within 360-degree ranges with respect to the robot. LiDAR information sensed in a specific position may constitute a single LiDAR frame. That is, the LiDAR sensor 220 senses a distance between an object disposed outside the robot and the robot to generate a LIDAR frame.

As an example, a camera sensor 230 is a regular camera. To overcome viewing angel limitations, two or more camera sensors 230 may be used. An image captured in a specific position constitutes vision information. That is, the camera sensor 230 photographs an object outside the robot and generates a visual frame including vision information.

The robot 1, to which the present disclosure is applied, performs fusion-simultaneous localization and mapping (Fusion-SLAM) using the LiDAR sensor 220 and the camera sensor 230.

In fusion SLAM, LiDAR information and vision information may be combinedly used. The LiDAR information and vision information may be configured as maps.

Unlike a robot that uses a single sensor (LiDAR-only SLAM, visual-only SLAM), a robot that uses fusion-SLAM may enhance accuracy of estimating a position. That is, when fusion SLAM is performed by combining the LiDAR information and vision information, map quality may be enhanced.

The map quality is a criterion applied to both of the vision map comprised of pieces of vision information, and the LiDAR map comprised of pieces of LiDAR information. At the time of fusion SLAM, map quality of each of the vision map and LiDAR map is enhanced because sensors may share information that is not sufficiently acquired by each of the sensors.

Additionally, LiDAR information or vision information may be extracted from a single map and may be used. For example, LiDAR information or vision information, or all the LiDAR information and vision information may be used for localization of the robot in accordance with an amount of memory held by the robot or a calculation capability of a calculation processor, and the like.

An interface unit 290 receives information input by a user. The interface unit 290 receives various pieces of information such as a touch, a voice and the like input by the user, and outputs results of the input. Additionally, the interface unit 290 may output a map stored by the robot 1 or may output a course in which the robot moves by overlapping on the map.

Further, the interface unit 290 may supply predetermined information to a user.

A controller 250 generates a map as in FIG. 4 that is described below, and on the basis of the map, estimates a position of the robot in the process in which the robot moves.

A communication unit 280 may allow the robot 1 to communicate with another robot or an external server and to receive and transmit information.

The robot 1 may generate each map using each of the sensors (a LiDAR sensor and a camera sensor), or may generate a single map using each of the sensors and then may generate another map in which details corresponding to a specific sensor are only extracted from the single map. Additionally, the map of the present disclosure may include odometry information on the basis of rotations of wheels. The odometry information is information on distances moved by the robot, which are calculated using frequencies of rotations of a wheel of the robot, or a difference in frequencies of rotations of both wheels of the robot, and the like. The robot may calculate a distance moved by the robot on the basis of the odometry information as well as the 30 information generated using the sensors. The controller 250 in FIG. 2 may further include an artificial intelligence unit 255 for artificial intelligence work and processing.

A plurality of LiDAR sensors 220 and camera sensors 230 may be disposed outside of the robot 1 to identify external objects.

In addition to the LiDAR sensor 220 and camera sensor 230 in FIG. 2, various types of sensors (a LiDAR sensor, an infrared sensor, an ultrasonic sensor, a depth sensor, an image sensor, a microphone, and the like) are disposed outside of the robot 1. The controller 250 collects and processes information sensed by the sensors.

The artificial intelligence unit 255 may input information that is processed by the LiDAR sensor 220, the camera sensor 230 and the other sensors, or information that is accumulated and stored while the robot 1 is moving, and the like, and may output results required for the controller 250 to determine an external situation, to process information and to generate a moving path.

As an example, the robot 1 may store information on positions of various objects, disposed in a space in which the robot is moving, as a map. The objects include a fixed object such as a wall, a door and the like, and a movable object such as a flower pot, a desk and the like. The artificial intelligence unit 255 may output data on a path taken by the robot, a range of work covered by the robot, and the like, using map information and information supplied by the LiDAR sensor 220, the camera sensor 230 and the other sensors.

Additionally, the artificial intelligence unit 255 may recognize objects disposed around the robot using information supplied by the LiDAR sensor 220, the camera sensor 230 and the other sensors. The artificial intelligence unit 255 may output meta information on an image by receiving the image. The meta information includes information on the name of an object in an image, a distance between an object and the robot, the sort of an object, whether an object is disposed on a map, and the like.

Information supplied by the LiDAR sensor 220, the camera sensor 230 and the other sensors is input to an input node of a deep learning network of the artificial intelligence unit 255, and then results are output from an output node of the artificial intelligence unit 255 through information processing of a hidden layer of the deep learning network of the artificial intelligence unit 255.

The controller 250 may calculate a moving path of the robot using date calculated by the artificial intelligence unit 255 or using data processed by various sensors.

Figure 3:
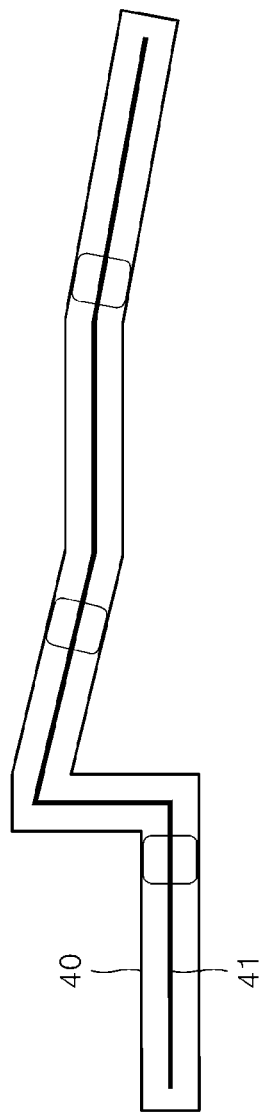
FIG. 3 shows a process in which a robot moves in a space.

The robot in FIG. 2 may perform any one or more of the above-described functions of generating a map and estimating a position while the robot is moving using the map. FIG. 3 shows an example of a space in which the robot in FIG. 2 generates a map, or estimates a position using a map.

FIG. 3 shows a process in which a robot moves in a space. The robot in the space 40 may move along a line indicated by reference No. 41, and may store information, sensed by the LiDAR sensor in a specific spot, in a map storage 210 using the LiDAR sensor 220. A basic shape of a space 40 may be stored as a local map.

Additionally, the robot may store information sensed by the camera sensor in a specific spot, in the map storage 210 using the camera sensor 230 while the robot is moving in the space 40.

Further, the robot may move in the space of FIG. 3, and the robot confirms current position by comparing stored information in the map storage 210.

Figure 4:
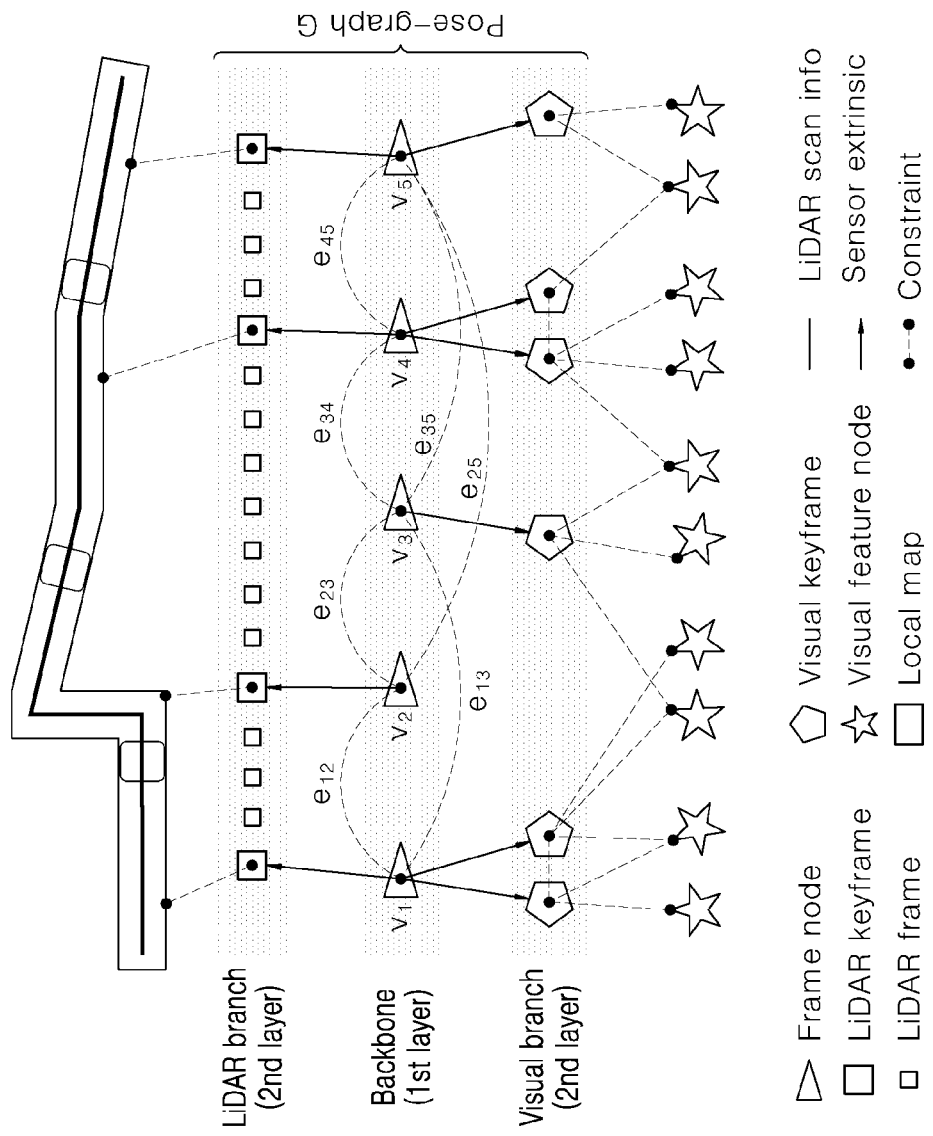
FIG. 4 shows a multiple structure of a map according to an embodiment.

FIG. 4 shows a multiple structure of a map according to an embodiment. FIG. 4 shows a double-layer structure in which a backbone is a first layer, and a LiDAR branch and a visual branch are respectively a second layer. The structure as in FIG. 4 is referred to as a structurally elastic pose graph-based SLAM.

The backbone is information on a trajectory of the robot. Additionally, the backbone includes one or more frame nodes corresponding to the trajectory. The frame nodes further include constraint information in a relation between the frame nodes and other frame nodes. An edge between nodes denotes constraint information. The edge denotes odometry constraint information (odometry constraint) or loop constraint information (loop constraint).

The LiDAR branch of the second layer is comprised of LiDAR frames. The LiDAR frames include a LIDAR sensing value that is sensed while the robot is moving. At least one or more of the LiDAR frames are set as a LiDAR keyframe.

The LiDAR keyframe has a corresponding relation with the nodes of the backbone. In FIG. 4, nodes v1, v2, v4, and v5 of the backbone indicate a LiDAR keyframe among nodes v1 to v5 of the backbone.

The visual branch of the second layer is comprised of visual keyframes. The visual keyframes indicate one or more visual feature nodes that are camera sensing values (i.e., an image captured by the camera) sensed while the robot is moving. The robot may generate a plurality of visual feature nodes on the basis of the number of camera sensors disposed in the robot.

In the map structure of FIG. 4, the LiDAR keyframe or the visual keyframe is connected to the frame node of the backbone. Certainly, the LiDAR/visual keyframe may all be connected to a single frame node (v1, v4 and v5).

Poses of the robot at the LiDAR or the visual keyframe are same, and the LiDar or the visual keyframe is connected with each frame node. An extrinsic parameter may be added for each keyframe on the basis of a position of the robot, to which the LiDAR sensor or the camera sensor is attached. The extrinsic parameter denotes information on a relative position at which a sensor is attached from the center of the robot.

The visual keyframe has a corresponding relation with the node of the backbone. In FIG. 4, nodes v1, v3, v4, and v5 of the backbone indicate a visual keyframe among nodes v1 to v5 of the backbone. In FIG. 2, a pair of visual feature nodes (visual frames), comprised of two visual feature nodes, denote that the robot 1 captures an image using two camera sensors 230. There is an increase and a decrease in the number of visual feature nodes in each position on the basis of an increase and a decrease in the number of camera sensors 230.

Edges are displayed between nodes v1 to v5 constituting the backbone of the first layer. e12, e23, e34, and e45 are edges between adjacent nodes, and e13, e35, and e25 are edges between non-adjacent nodes.

Odometry constraint information, or for short, odometry information denotes constraints between adjacent frame nodes such as e12, e23, e34, and e45. Loop constraint information, or for short, loop information denotes constraints between non-adjacent frames such as e13, e25, and e35.

The backbone is comprised of a plurality of keyframes. The controller 250 may perform an initial mapping process to add the plurality of keyframes to the backbone. The initial mapping process includes adding the LiDAR keyframe and the visual frame based on the keyframe.

The structure of FIG. 4 is briefly described as follows. The LiDAR branch includes one or more LiDAR frames. The visual branch includes one or more visual frames.

Additionally, the backbone includes two or more frame nodes in which any one or more of a LIDAR frame or a visual frame is registered. In this case, the LiDAR frame or the visual frame registered in the frame node is referred to as a keyframe. A pose graph includes the LiDAR branch, the visual branch and the backbone.

Further, the pose graph includes odometry information, loop information and the like among frame nodes. The odometry information includes information on rotations, directions, and the like of wheels, which is generated while the robot is moving between frames nodes. The loop information is based on a set of frame nodes connected using specific constraints between visual keyframes around a specific frame node within a maximum sensing distance of the LiDAR sensor 220.

The controller 250 generates the pose graph in FIG. 4. The controller 250 stores the LiDAR branch, the visual branch, the backbone, the odometry information between frame nodes, and the pose graph including the premises in the map storage 210.

As described above, the pose graph as in FIG. 4 may be generated by the robot offering the function of generating a map and may be stored in a map storage 210 of all robots offering the function of driving.

The pose graph in FIG. 4 may be used for estimation of a position by the robot 1 even when any one of the camera sensor 230 and the LiDAR sensor 220 can operate. Alternately, the robot 1 may use another sensor and may enhance accuracy of estimating a position when any one sensor among sensors of the robot has low accuracy or when a plurality of positions are detected in response to information acquired by any one sensor.

For example, the robot 1 including one or more camera sensors 230 and one or more LiDAR sensors 220 may estimate a position using information acquired by multi sensors during fusion-SLAM. The robot 1 may estimate a position when any one of the results of estimation of positions that are estimated using each sensor is true.

Alternately, the robot 1 may estimate a position using information of each sensor, stored in the map storage 210, even when only some of the sensors of the robot 1 can operate or even when the robot 1 includes any one sensor. When a single LiDAR sensor 220 is used, the LiDAR sensor 220 covers 360 degrees.

The robot 1 may include one or more LiDAR sensors 220 depending on an angle that may be covered by the LiDAR sensor 220. Further, the robot 1 may include one or more camera sensors 230 to overcome limitations of viewing angles.

The robot, as described above, may draw up a map and estimate a position using one or more LiDAR sensors 220 and one or more camera sensors 230.

The robot may carry out two processes when performing SLAM. The robot 1 may carry out a mapping process of drawing up a map that takes the pose graph in FIG. 4 as an example and a localization process using the map drawn up. Alternately, the robot 1 may carry out any one of the processes. The robot 1 may be classified as a robot that carries out only the mapping process, and a robot that carries out only the localization process.

The robot, as in FIG. 4, may store the map actually drawn up by the robot. In addition, the robot may store a CAD map on an inside of an existing building.

Below, a process of updating the map drawn up for localization by the robot 1 with additional information is described. The controller 250 of the robot 1 may update the map that is previously drawn up for localization and that is stored in the map storage 210 with additional information.

The above-described CAD map, which is map information in relation to building design, may differ from information on an actual space where the robot 1 moves. Accordingly, the controller 250 of the robot 1 needs to update the information on the actual space.

In case a structure or a sign and the like of a building are changed, the map needs to be updated with information on the changed structure or sign and the like of the building. For example, the controller 250 of the robot 1 may confirm a structural change such as a newly built fake wall, or a removed door and the like, and may update the map with details in relation to the change. An added sign or a changed sign and the like belong to a visual change. The controller 250 of the robot 250 may confirm the visual change and may update the map with details in relation to the change.

In this case, the controller 250 may use existing information that is previously stored. For example, the controller 250 maintains an alignment between the existing map and the updated details such that point of interest (POI) information is maintained.

That is, the controller 250 does not change a coordinate of the POI during the process of updating a coordinate to maintain the alignment between the added map and the existing map. As an example, the controller 250 does not change a coordinate (100, 100) of a drugstore into a coordinate (120, 120) at the time of updating.

Figure 5:
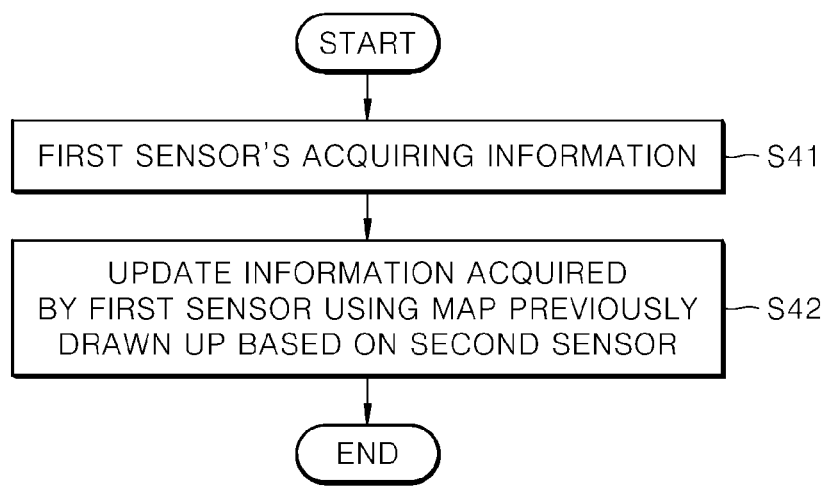
FIG. 5 shows a process in which a robot according to an embodiment updates a map.

FIG. 5 shows a process in which a robot according to an embodiment updates a map. The robot 1 is holding a map as in FIG. 4 using two types of sensors. The robot may acquire first type information using a first sensor and may perform SLAM. Likewise, the robot may acquire second type information using a second sensor and may perform SLAM.

Certainly, information required to perform SLAM, i.e., a map of a space where the robot moves is stored in the map storage 210. The robot loads the map and performs SLAM. The map storage 210 may store a LiDAR map as a map used for the LiDAR sensor 220 to perform SLAM. Further, the map storage 210 stores a visual map used for the camera sensor 230 to perform SLAM.

In FIG. 5, the first sensor of the robot senses a surrounding structure and acquires information (S41).

For example, in case the first sensor is a LiDAR sensor 220, sensing data which is acquired by the LiDAR sensor and to which a shape of a two-dimensional or three-dimensional space structure is applied is an example of the information acquired by the first sensor.

For example, in case the first sensor is a camera sensor 230, image information acquired by the camera sensor is an example of the information acquired by the first sensor.

The controller 250 of the robot 1 updates the information acquired by the first sensor using a map that is drawn up on the basis of the information generated by the second sensor (S42). That is, the robot performs SLAM using the second sensor. The controller 250 of the robot estimates a current position of the robot using a second map of a second type, and updates a first map with the first type information acquired by the first sensor and stores the same in the map storage 210 with respect to the estimated position.

For example, in case the second sensor is a camera sensor 230, a pose graph (visual pose-graph) comprised of a visual feature node, a visual frame, a visual key frame and the like is an example of a map that is drawn up on the basis of the information generated by the second sensor.

For example, in case the first sensor is a LiDAR sensor 220, a pose graph comprised of a LiDAR frame, a LiDAR key frame and the like is an example of a map that is drawn up on the basis of the information generated by the first sensor. Alternately, a LiDAR-based occupancy grid map is an example of the map.

Figure 6:
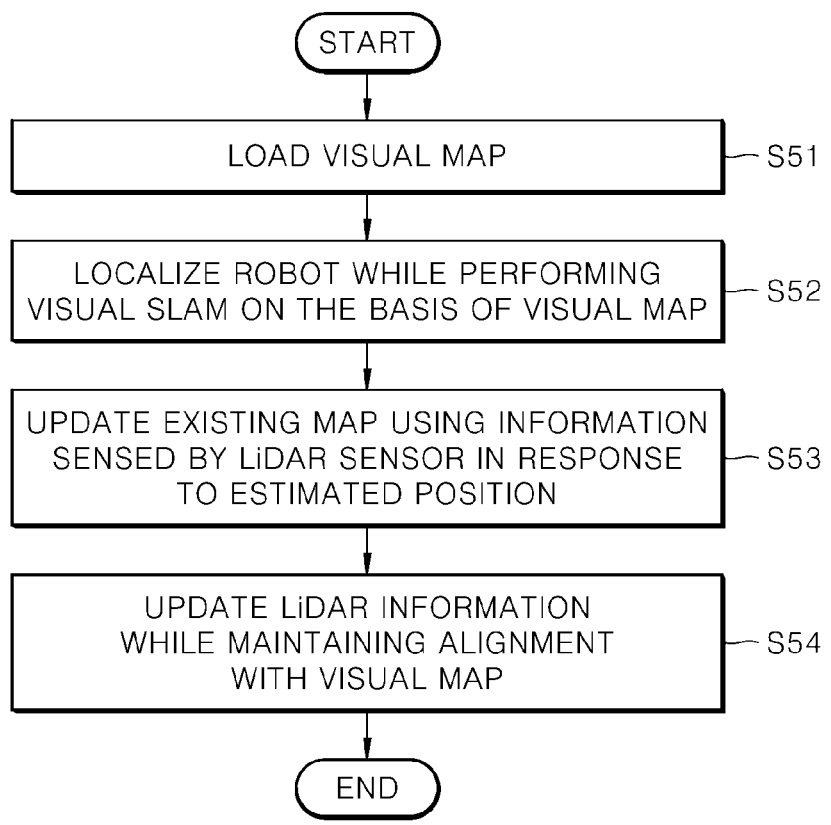
FIG. 6 is an updating process according to an embodiment in case a first sensor is a LiDAR sensor and a second sensor is a camera sensor.

FIG. 6 is an updating process according to an embodiment in case a first sensor is a LiDAR sensor and a second sensor is a camera sensor. The embodiment in FIG. 6 is referred to as LiDAR partial mapping.

The controller 250 of the robot 1 loads a visual map (a visual pose-graph) that is drawn up on the basis of an existing camera sensor 230, from the map storage 210 (S51).

A total collection of visual feature nodes connected with visual branches in the embodiment of FIG. 4 is as an example of the visual map.

As illustrated using the second map of the second type in FIG. 5, the controller 250 performs visual SLAM and localizes the robot on the basis of a visual map (S52). This denotes performing visual feature matching by the robot using the loaded visual map. In this case, a 3D-2D algorithm may be applied.

In this case, assume that the estimated position of the robot is accurate. The controller 250 of the robot 1 updates an existing map (the first map described with reference to FIG. 5) with information (LiDAR sensing data) sensed by the LiDAR sensor, i.e., with respect to the estimated position of the robot, i.e., in response to the estimated position of the robot (S53).

A LIDAR map that is previously drawn up and stored in the map storage 210 by the robot, or a CAD map that is comprised of CAD information is an example of the existing map. In this process, the controller 250 may update LiDAR information while maintaining an alignment with the loaded visual map (S54).

For example, the controller 250 additionally stores information (a LiDAR branch or an occupancy grid map) in relation to the LiDAR sensor 220 in the map storage 210 under the assumption that a position confirmed as a result of VISUAL slam through the visual map is accurate. Registering information acquired by the LiDAR sensor 220 additionally on the pose graph in FIG. 4 is an example of the above-described process. The controller 250 maintains pieces of information that constitute the visual map. Thus, an alignment between the visual map and the first map (a CAD map or a LiDAR map) is maintained.

Then, at the time of map optimization or graph optimization, the controller performs optimization only of newly registered LiDAR information without using the existing visual map. This is because the LiDAR information is only changed while the existing visual map is not changed in S51 to S54.

Figure 7:
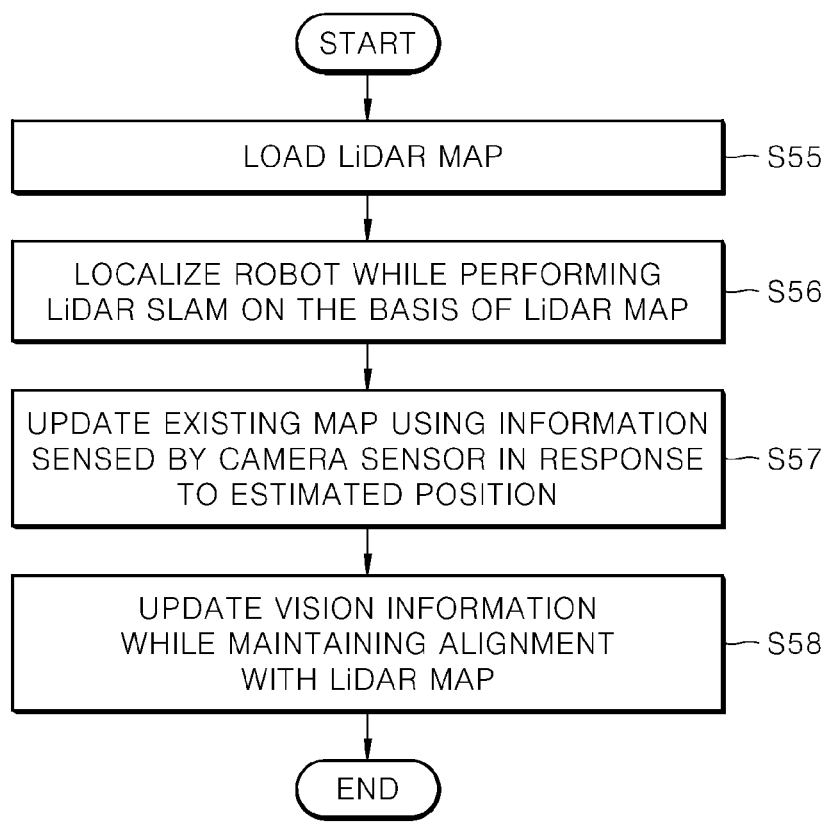
FIG. 7 shows an updating process according to an embodiment in case a first sensor is a camera sensor and a second sensor is a LiDAR sensor.

FIG. 7 shows an updating process according to an embodiment in case a first sensor is a camera sensor and a second sensor is a LIDAR sensor. The embodiment in FIG. 7 is referred to as visual partial mapping.

The second map of the second type in FIG. 5 corresponds to a LiDAR map. The controller 250 of the robot 1 loads a LiDAR map (a LiDAR branch or an occupancy grid map) that is drawn up on the basis of an existing LiDAR sensor 220, from the map storage 210 (S55). A total collection of occupancy grid maps, i.e., local maps, connected to the LiDAR branch in the embodiment of FIG. 4 is an example of the LiDAR map.

The controller 250 estimates a position of the robot 1 while performing LiDAR SLAM on the basis of the LiDAR map that takes an occupancy grid map as an example (S56). In this case, the controller 250 may apply both of the iterative closest point (ICP) and the Monte-Carlo Localization as a method of localization using LiDAR SLAM.

According to the ICP method, the robot matches LiDAR scan data generated by the LiDAR sensor 220 of the robot 1 using a previously stored LiDAR map with a stored local map. When a match rate is at a predetermined level or higher, the controller 250 may estimate a current position of the robot.

As an example, in case there is a LiDAR map that is drawn up by the robot 1 during the process of localization, the controller 250 performs localization using the ICP because the drawn up LiDAR map is likely to be matched with the stored map.

Further, in case the robot 1 uses a CAD map, the CAD map is likely to differ from the stored LiDAR map. Accordingly, the controller 250 performs localization using the MCL.

In this case, assume that the estimated position of the robot is accurate. The controller 250 of the robot 1 updates an existing map with information (a visual pose-graph) sensed by the visual sensor 230 with respect to the estimated position of the robot, i.e., in response to the estimated position of the robot (S57). A map that is previously drawn up and stored by the robot or a CAD map is an example of the existing map.

In this process, the controller 250 may update visual information while maintaining an alignment with the loaded LiDAR map (S58).

For example, the controller 250 additionally stores information (a visual branch or a visual feature node and the like) in relation to the camera sensor 230 as a visual map in the map storage 210 under the assumption that a position confirmed as a result of LiDAR SLAM through the LiDAR map is accurate.

Registering information acquired by the camera sensor 230 additionally on the pose graph in FIG. 4 is an example of the above-described process. The visual map corresponds to the first map that is described with reference to FIG. 5. Certainly, the controller 250 may update a CAD map comprised of CAD information.

The controller 250 maintains pieces of information that constitute the LiDAR map. Thus, an alignment between the LiDAR map and the first map (a CAD map or a visual map) is maintained.

Then, at the time of map optimization or graph optimization, the controller performs optimization only of newly registered visual information without using the existing LiDAR map. This is because the visual information is only changed while the existing LiDAR map is not changed in S55 to S58.

To maintain the alignment in S54 and S58 of FIG. 6 and FIG. 7, the controller 250 of the robot 1 updates the map with newly added information while maintaining information of the map that is considered a reference.

As an example, the controller 250 of the robot 1 determines that a map generated on the basis of another sensor has no error to update a map using information sensed by one sensor. For example, while updating a visual map using the camera sensor, the controller 250 of the robot 1 determines that a LiDAR map stored in the map storage 210 has no error.

Likewise, while updating a LiDAR map using the LiDAR sensor, the controller 250 of the robot 1 determines that a visual map stored in the map storage 210 has no error.

The robot 1 determines that a map of any one sensor is accurate and performs localization, and performs mapping of sensor information sensed by another sensor.

For example, the controller 250 of the robot 1 determines that a LiDAR sensor 220-based map has no error and performs localization, and updates the map by only applying visual information sensed by the camera sensor 230 to a visual map. In this case, an alignment between the previously stored LiDAR map and the newly updated visual map is maintained.

Likewise, the controller 250 of the robot 1 determines that a camera sensor 230-based map has no error and performs localization, and updates the map by only applying LiDAR information sensed by the LiDAR sensor 220 to a LiDAR map. In this case, an alignment between the previously stored visual map and the newly updated LiDAR map is maintained.

Further, optimization may be performed after the update (S54 and S58) in FIGS. 6 and 7.

Figure 8:
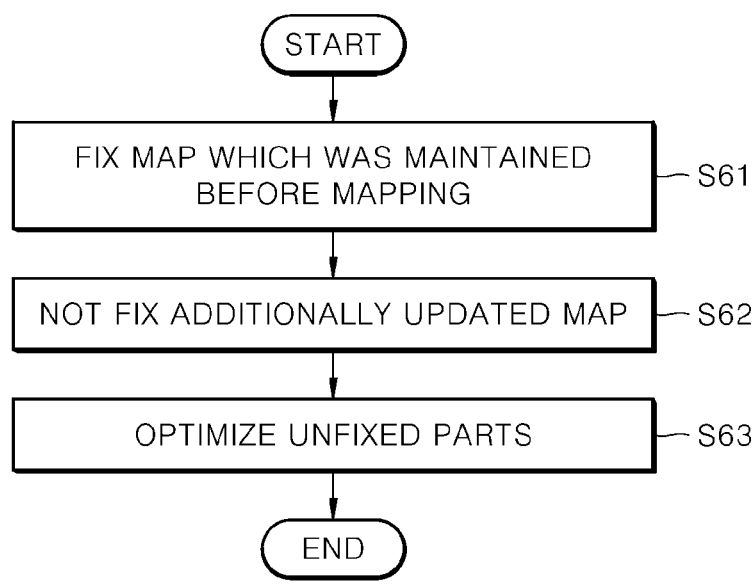
FIG. 8 shows an optimization process according to an embodiment.

FIG. 8 shows an optimization process according to an embodiment.

The controller 250 fixes a map that is maintained by the robot prior to mapping (S61). This process denotes setting the process such that no change is made during the optimization process. Next, the controller 250 does not fix an additionally updated map (S62). This process denotes setting the process such that a change is made during the optimization process.

Then the controller 250 performs optimization of parts that are not fixed (S63). Thus, pieces of newly added information are only optimized.

For example, described is a case in which partial mapping is performed in a state where maps generated by two types of sensor are all stored in the map storage 210. As an example, described as follows is application of S61 to S63 as an optimization process in case only a visual map is additionally updated in a state where the visual map and a LiDAR map are all stored.

In case optimization of a graph is performed after the graph is configured as in FIG. 4, the controller 250 fixes a visual map (a vision map) that is previously stored. Additionally, the controller 250 does not fix an additionally updated visual map and performs optimization.

For example, in case visual feature nodes of v1 to v100 are previously stored information, and v101 to v150 are additionally updated information, the controller 250 sets the nodes of v1 to v100 not to move. Additionally, the controller 250 sets the nodes of v101 to v150 to move and performs optimization. In this case, during the process of optimization, the nodes of v101 to v150 are only changed.

Thus, the information that is stored previously by the robot 1 may not be changed, and an alignment between the information and a pre-stored map may be maintained even during the process of optimization by the controller 250.

In summary, the controller 250 maintains information of the second map and only optimizes pieces of added information of the first map.

In case the above-described embodiments are applied, the robot may improve accuracy by updating other types of maps with respect to a single map.

Figure 9:
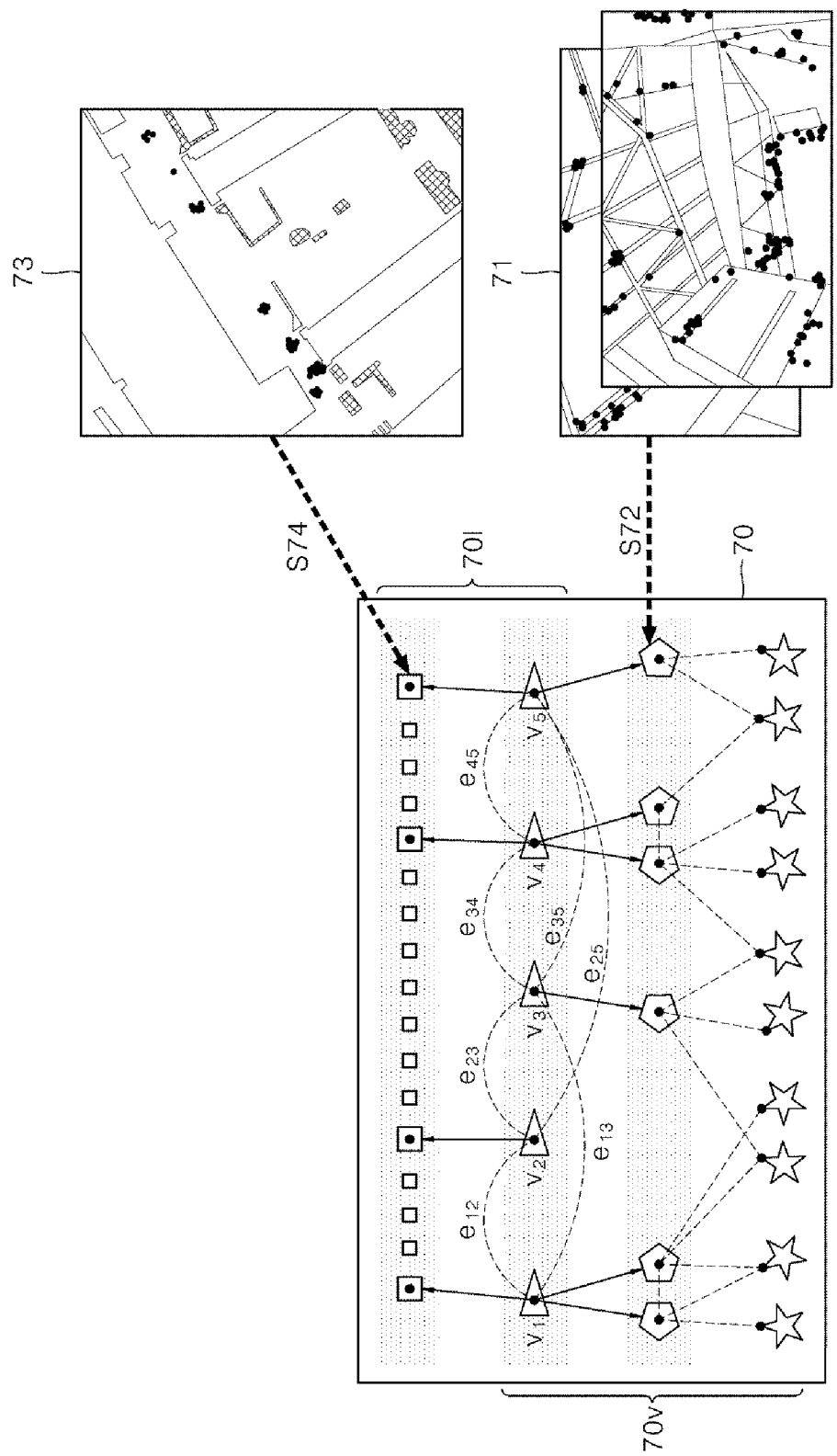
FIGS. 9 and 10 show an embodiment in which LiDAR information is added to a map on the basis of a visual map according to an embodiment.
Figure 10:
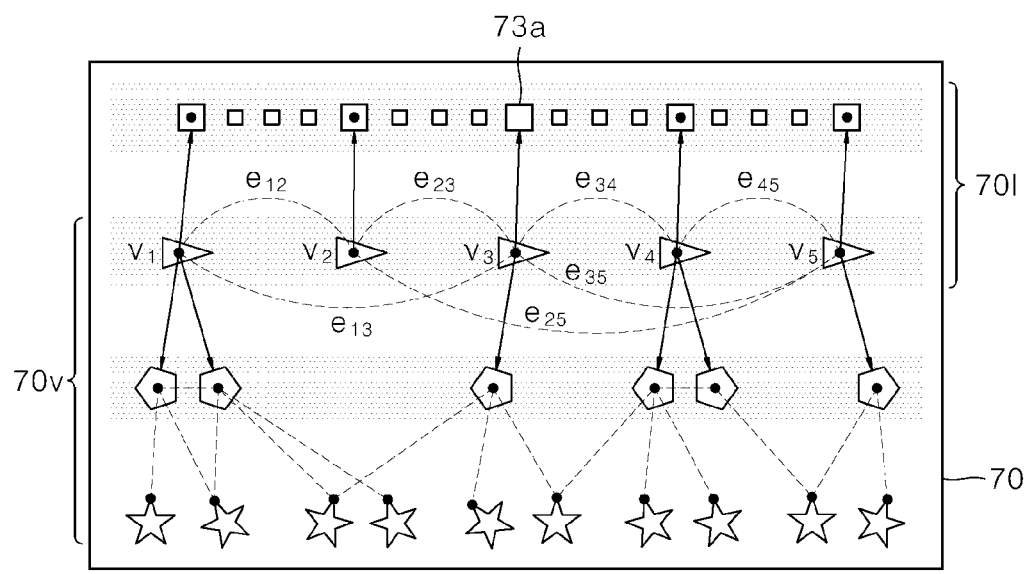

FIGS. 9 and 10 show an embodiment in which LiDAR information is added to a map on the basis of a visual map according to an embodiment.

Reference numeral 70 indicates a map stored in the map storage. A visual branch that constitutes a visual map and a LiDAR branch that constitutes a LiDAR map are presented as 70. The LiDAR map may be optionally included. Alternately, the map storage 210 may store a CAD map rather than the LiDAR map.

Accordingly, 70v indicates the visual map and 70l indicates the LiDAR map.

The controller 250 of the robot 1 performs visual SLAM where image information 71 captured by the camera sensor 230 is compared with images of the visual map (70v). As a result, as in S72, an image that is considered to have the same position by the controller is searched, and the controller determines that a current position of the robot is the frame node of v5.

In this case, the controller 250 of the robot 1 updates the LiDAR map 701 by associating information 73 sensed by the LiDAR sensor 220 with the position of v5.

In case the image information 71 captured by the camera sensor 230 is the same as an image registered in the frame node of v3 and the controller 250 determines that a current position of the robot is the frame node of v3, the controller 250 may add a new LiDAR frame to the sensed data of 73. In this case, like 73a in FIG. 10, the new LiDAR frame is added to the LiDAR map (701).

Figure 11:
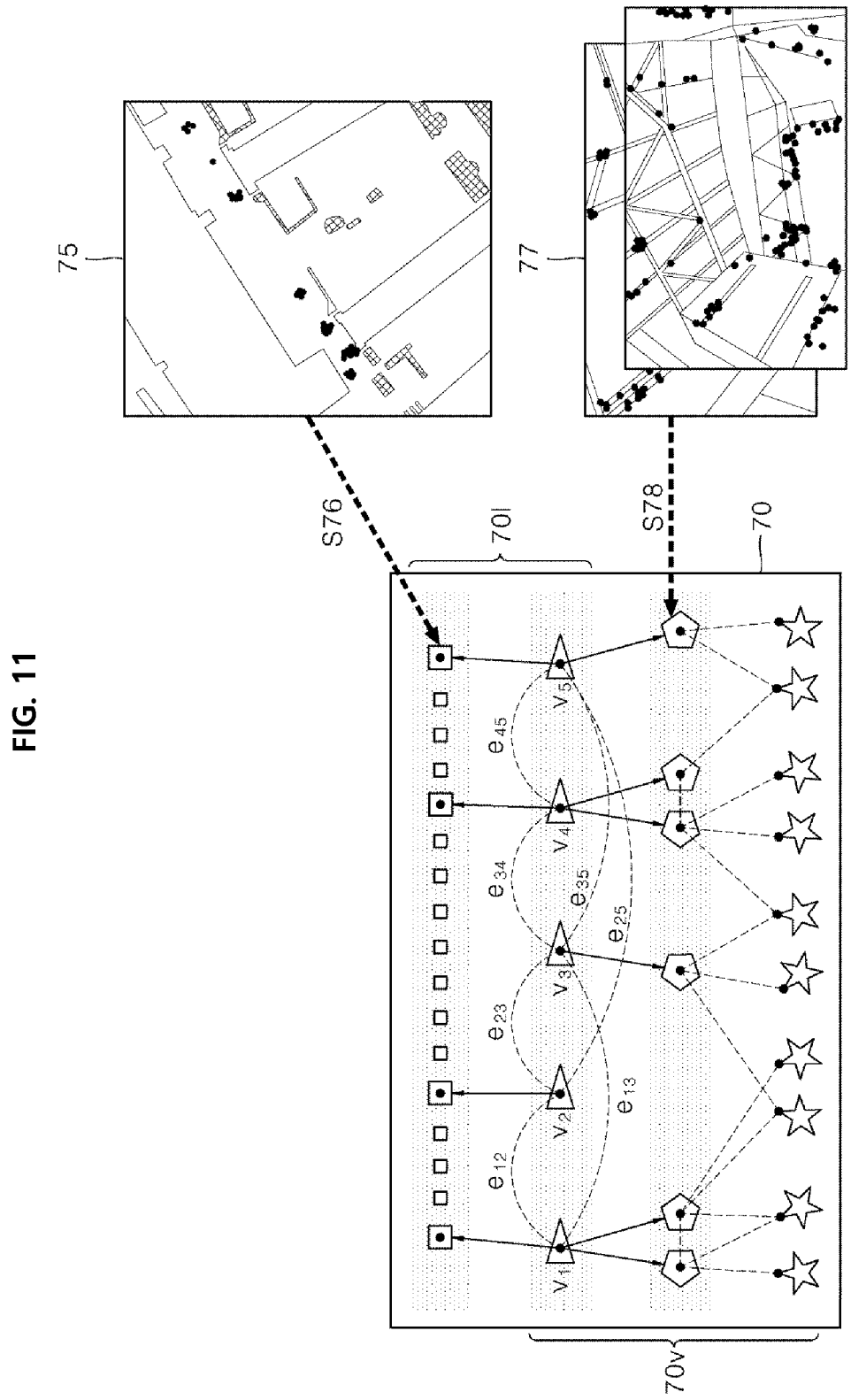
FIGS. 11 and 12 show an embodiment in which visual information is added to a map on the basis of a LiDAR map according to an embodiment.
Figure 12:
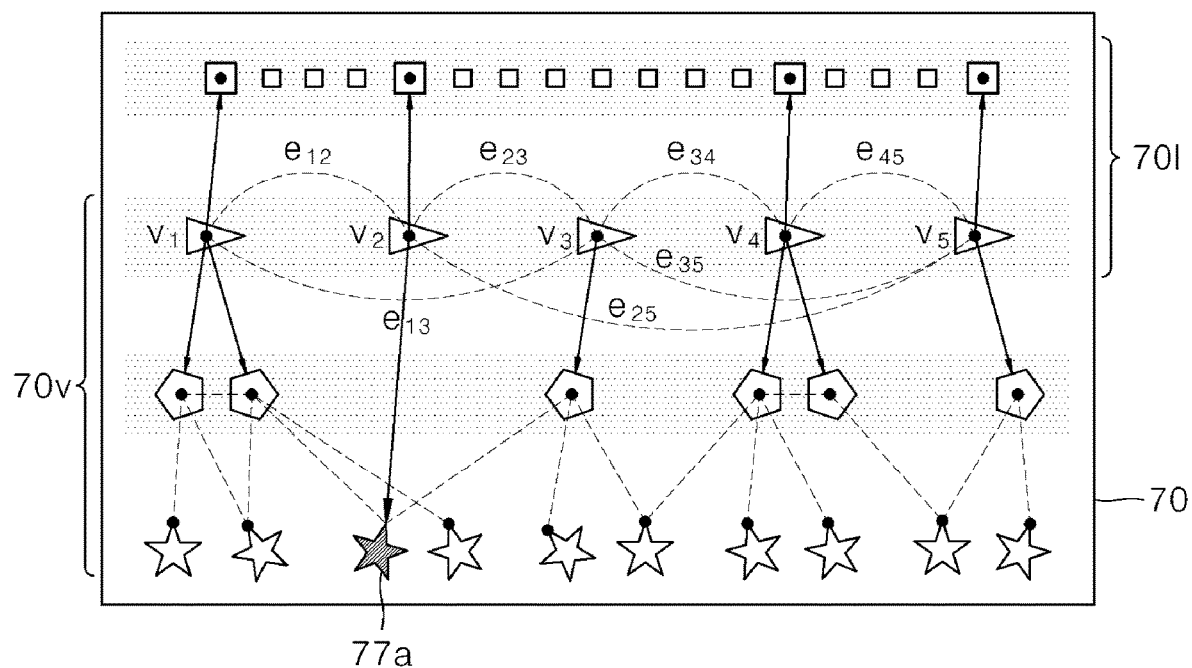

FIGS. 11 and 12 show an embodiment in which visual information is added to a map on the basis of a LiDAR map according to an embodiment.

Reference numeral 70 indicates a map stored in the map storage. A visual branch that constitutes a visual map and a LiDAR branch that constitutes a LiDAR map are presented as reference numeral 70. The visual map may be optionally included. Alternately, the map storage 210 may store a CAD map rather than the visual map.

Accordingly, 70v indicates the visual map and 70l indicates the LiDAR map.

The controller 250 of the robot 1 performs LiDAR SLAM where LiDAR sensing information 75 captured by the LiDAR sensor 220 is compared with LiDAR frames of the LiDAR map (701). As a result, as in S76, an image that is considered to have the same position by the controller is searched, and the controller determines that a current position of the robot is the frame node of v5.

In this case, the controller 250 of the robot 1 updates the visual map 70v by associating information 77 captured by the camera sensor 230 with the position of v5.

In case the LiDAR sensing information 75 captured by the LiDAR sensor 220 is the same as a LiDAR frame registered in the frame node of v2 and the controller 250 determines that a current position of the robot is the frame node of v2, the controller 250 may add the captured image 77 to the frame node of v2. In this case, like 77a in FIG. 12, a new visual frame is added to the visual map (70v).

When a map that is previously drawn up needs to be updated with additional information in case the above-described embodiment is applied, the robot uses fusion SLAM. That is, the robot may perform localization using information acquired by any one sensor and may update a map with information acquired by another map. In this process, pieces of information of the maps preciously used for localization are maintained. Accordingly, a new map may only be added while an alignment between the maps is maintained.

While the robot 1 performs SLAM, each sensor may acquire information at an area with high accuracy of localization or at an area with low accuracy of localization, and the robot 1 may store the information. Additionally, the robot 1 may learn the stored information using an artificial intelligence module and may repeatedly apply the information acquired at the area with low accuracy of localization or at the area with high accuracy of localization to the pose graph.

To this end, the artificial intelligence unit 255 of the controller 250 is a type of learning processor. The artificial intelligence unit 255 may process position information cumulatively stored by the robot 1 and information acquired by sensors, and numerical values on accuracy of localization and may update the pose graph.

Artificial intelligence refers to a field of researching artificial intelligence or researching methodologies for creating artificial intelligence, and machine learning refers to a field of defining various problems in the field of artificial intelligence and researching methodologies for solving the problems. The machine learning is defined as an algorithm that improves the performance of a task through consistent experiences with the task.

An artificial neural network (ANN) is a model used in machine learning and may refer to any kind of model having a problem-solving capability, the model being composed of artificial neurons (nodes) forming a network by a combination of synapses. The ANN may be defined by a connection pattern between neurons in different layers, a learning process for updating model parameters, and an activation function for generating an output value.

The ANN may include an input layer and an output layer. Optionally, the ANN may further include one or more hidden layers. Each layer may include one or more neurons, and the ANN may include synapses for connecting the neurons. In the ANN, each neuron may output function values of the activation function associated with input signals, weights, and deflections that are received through the synapses.

The model parameters refer to parameters determined through learning and include synapse connection weights, neuron deflections, and the like. Also, hyperparameters refer to parameters to be set before learning in a machine learning algorithm and includes a learning rate, the number of repetitions, a minimum placement size, an initialization function, and the like.

The training purpose of the ANN can be regarded as determining model parameters that minimize a loss function. The loss function may be used as an index for determining an optimal model parameter during the learning process of the ANN.

The machine learning may be classified as supervised learning, unsupervised learning, or reinforcement learning depending on the learning scheme.

The supervised learning may refer to a method of training the ANN while a label for learning data is given, and the label may refer to an answer (or a result value) to be inferred by the ANN when the learning data is input to the ANN. The unsupervised learning may refer to a method of training the ANN while the label for the learning data is not given. The reinforcement learning may refer to a learning method for training an agent defined in any embodiment to select an action or a sequence of actions that maximizes cumulative reward in each state.

Machine learning implemented using a deep neural network (DNN) including a plurality of hidden layers in the ANN will be called deep learning, and the deep learning is a portion of the machine learning. In the following description, the machine learning is used as a meaning including the deep learning.

For the robot 1, the artificial intelligence unit 255 in FIG. 2 may perform an artificial intelligence function.

In this case, the communication unit 280 of the robot 1 may transmit or receive data to or from external apparatuses such as the AI server 300, which will be described in FIG. 9, or a robot for providing another artificial intelligence function through wired and wireless communication technologies. For example, the communication unit 280 may transmit or receive sensor information, user inputs, learning models, control signals, and the like to or from external apparatuses.

In this case, the communication technology used by the communication unit 280 includes Global System for Mobile Communication (GSM), code-division multiple access (CDMA), Long Term Evolution (LTE), 5G, Wireless LAN (WLAN), Wireless-Fidelity (Wi-Fi), Bluetooth™, Radio-Frequency Identification (RFID), Infrared Data Association (IrDA), ZigBee, Near Field Communication (NFC), and the like.

The interface unit 290 may acquire various kinds of data.

In this case, the interface unit 290 may include a camera for receiving an image signal input, a microphone for receiving an audio signal, a user input unit for receiving information from a user, and the like. Here, information acquired by the LiDAR sensor 220, the camera sensor 230, or the microphone refers to sensing data, sensor information, and the like.

The interface unit 290, various kinds of sensors, the wheel encoder 260, and the like may acquire input data or the like to be used when an output is acquired using a learning model and learning data for learning a model. The aforementioned elements may acquire raw input data. In this case, the controller 250 or the artificial intelligence unit 255 may extract an input feature as a preprocessing process for the input data.

The artificial intelligence unit 255 may train a model composed of an ANN using learning data. Here, the trained ANN may be called a learning model. The learning model may be used to infer a result value not for the learning data but for new input data, and the inferred value may be used as a determination basis for the robot 1 to perform a certain operation.

In this case, the artificial intelligence unit 255 may perform artificial intelligence processing along with the artificial intelligence unit 355 of the AI server 300.

In this case, the artificial intelligence unit 255 may include a memory integrated or implemented in the robot 1. Alternatively, the artificial intelligence unit 255 may be implemented using a separate memory, an external memory coupled to the robot 1, or a memory held in an external apparatus.

The robot 1 may acquire at least one of internal information of the robot 1, environmental information of the robot 1, and user information using various sensors.

Sensors included in the robot 1 include a proximity sensor, an illumination sensor, an acceleration sensor, a magnetic sensor, a gyroscope sensor, an inertial sensor, an RGB sensor, an infrared sensor (IR sensor), a finger scan sensor, an ultrasonic sensor, an optical sensor, a microphone, a LiDAR sensor 220, a camera sensor 230, a radar sensor and the like.

The above-described interface unit 290 may generate output in relation to vision, hearing or touch and the like.

In this case, the interface unit 290 may include a display unit outputting visual information, a speaker outputting auditory information, a haptic module outputting tactile information and the like.

A memory built in the robot 1 may store data supporting various functions of the robot 1. For example, the memory may store input data, learning data, a learning model, a learning history, and the like which are acquired by the interface unit 290 or various kinds of sensors built in the robot 1.

The controller 250 may determine at least one executable operation of the robot 1 on the basis of information determined or generated using a data analysis algorithm or a machine learning algorithm. Also, the controller 250 may control the elements of the robot 1 to perform the determined operation.

To this end, the controller 250 may request, retrieve, receive, or utilize data of the artificial intelligence unit 255 or the memory and may control the elements of the robot 1 to execute a predicted operation or an operation determined as being desirable among the at least one executable operation.

In this case, when there is a need for connection to an external apparatus in order to perform the determined operation, the controller 250 may generate a control signal for controlling the external apparatus and transmit the generated control signal to the external apparatus.

The controller 250 may acquire intention information with respect to a user input and may determine a user's requirements based on the acquired intention information.

In this case, the controller 250 may acquire intention information corresponding to user input using at least one or more of a speech-to-text (STT) engine for transforming voice input into character strings or a natural language processing (NLP) engine for acquiring intention information of natural language.

In this case, at least part of at least one or more of the STT engine or the NLP engine may include an artificial intelligence network trained based on a machine learning algorithm. Additionally, at least one or more of the STT engine or the NLP engine may be trained by the artificial intelligence unit 255, or by the learning processor 340 of the AI server 300, or by distributed processing thereof.

The controller 250 may collect history information including details of operation of the robot 1, a user's feedback on operation of the robot and the like and may store the history information in the memory or the artificial intelligence unit 255, or may transmit the history information to an external device such as the AI server 300 and the like. The collected history information may be used to update a learning model.

The controller 250 may control at least part of components of the robot 1 to drive an application program stored in the memory 170. Further, the controller 250 may combine and operate two or more of the components included in the robot 1 to drive the application program.

Alternately, an additional artificial intelligence (AI) server communicating with the robot 1 may be provided and may process information supplied by the robot 1.

Figure 13:
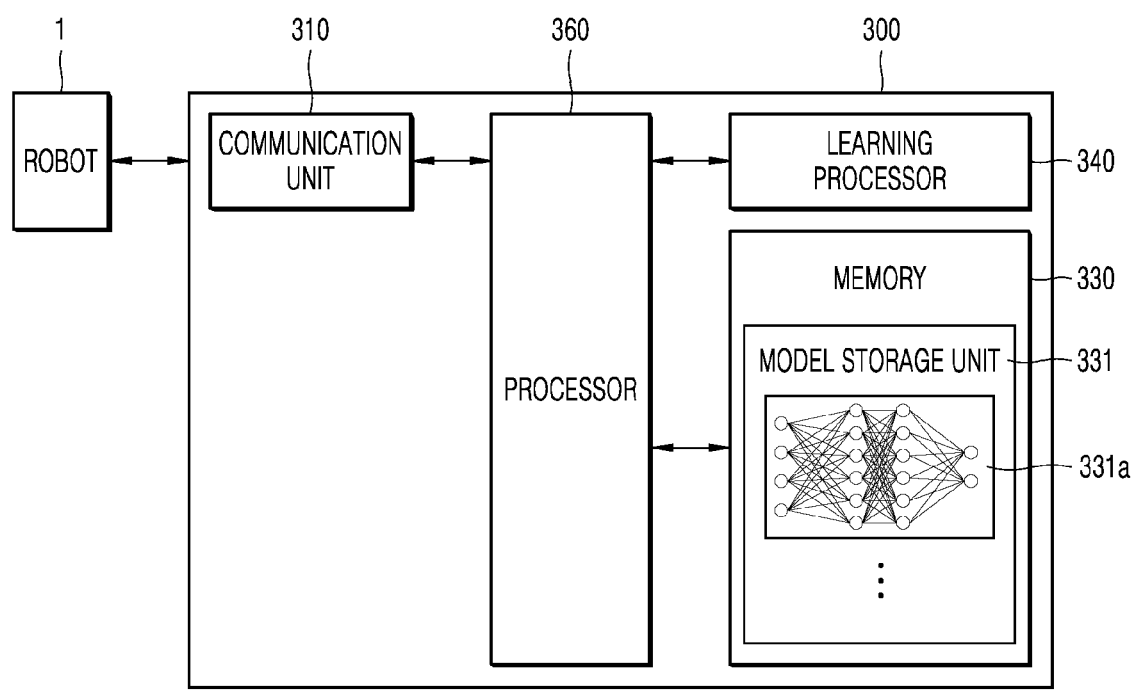
FIG. 13 shows a configuration of an AI sever according to an embodiment.

FIG. 13 shows a configuration of an AI server 300 according to an embodiment.

An artificial intelligence server, i.e., an AI server 300, may denote a device that trains an artificial neural network using a machine learning algorithm or that uses a trained artificial neural network. The AI server 300, which includes a plurality of servers, may perform distributed processing and may be defined as a 5G network. In this case, the AI server 300 may be included as a partial configuration of an AI device 100 and may perform at least part of AI processing together with the AI device 100.

The AI server 300 may include a communication unit 310, a memory 330, a learning processor 340 and a processor 360 and the like.

The communication unit 310 may transmit or receive data to or from an external device such as the robot 1 and the like.

The memory 330 may include a model storage unit 331. The model storage unit 331 may store a model 331a (or an artificial neural network) that is being trained or is trained through a learning processor 340.

The learning processor 340 may train the artificial neural network 331a using learning data. A learning model may be used in the state of being mounted onto the AI server 300 of the artificial neural network, or may be used in the state of being mounted onto an external device such as the robot 1 and the like.

The learning model may be implemented as hardware, software or a combination thereof. When all or part of the learning model is implemented as software, one or more instructions constituting the learning model may be stored in the memory 330.

The processor 360 may infer result values on new input data using the learning model, and may generate responses or control instructions based on the inferred result values.

Figure 14:
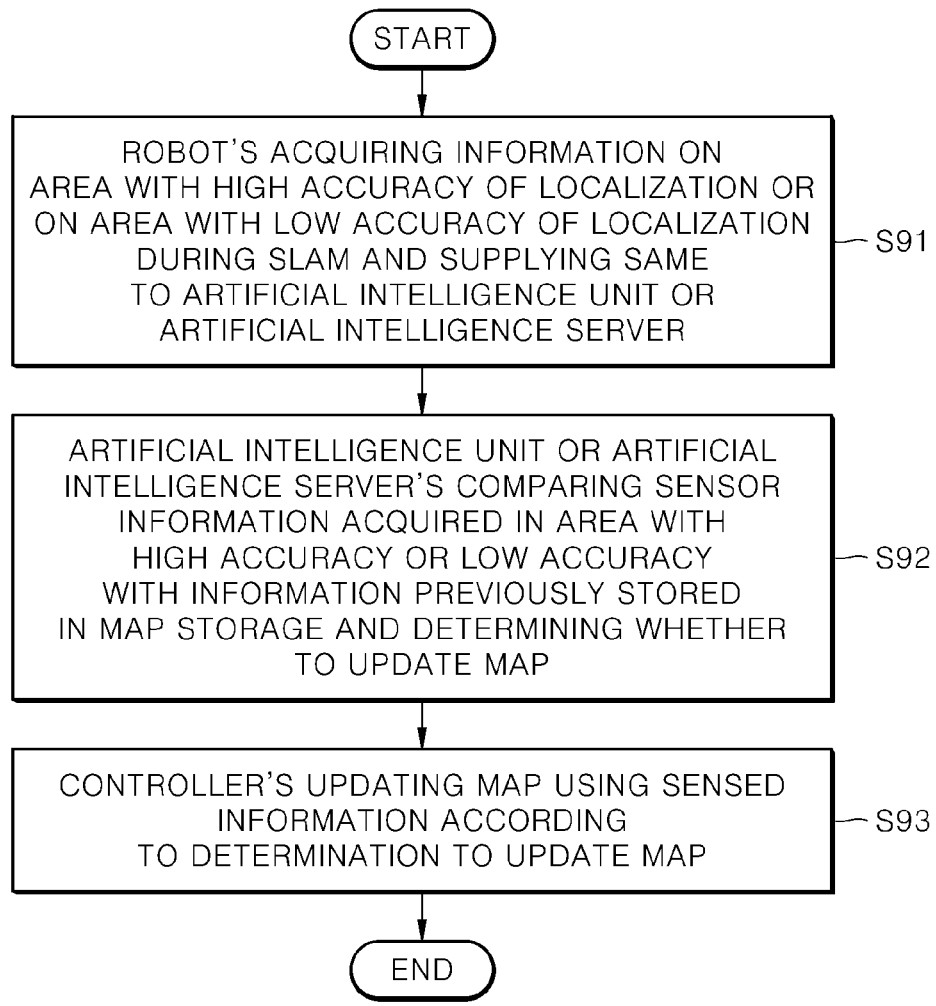
FIG. 14 shows a process in which a robot according to an embodiment updates a pose graph on the basis of artificial intelligence during SLAM.

FIG. 14 shows a process of updating a pose graph on the basis of artificial intelligence during SLAM of a robot according to an embodiment.

While performing SLAM, the robot acquires information on an area with high accuracy of localization or an area with low accuracy of localization. That is, the robot supplies information sensed by the LiDAR sensor 220 or the camera sensor 230, accuracy of localization preformed by the robot on the basis of the information, and position information to the artificial intelligence unit 255 or the AI server 300 (S91).

The artificial intelligence unit 255 or the artificial intelligence server 300 compares accuracy of pieces of information acquired by each sensor according to position information, using the supplied information. The artificial intelligence unit 255 or the artificial intelligence server 300 compares sensor information acquired at an area with high accuracy or with low accuracy with information previously stored in the map storage, and determines whether to update a map (S92).

Then the controller 250 updates the map using sensed information according to the determination to update the map (S93). As an example, the controller 250 may update a LiDAR frame/visual frame registered in the pose graph.

According to the process of FIG. 14, while the robot 1 performs SLAM, each sensor may acquire information at an area with high accuracy of localization or at an area with low accuracy of localization, and the robot 1 may store the information. Additionally, the robot 1 may learn the stored information using an artificial intelligence module and may repeatedly apply the information acquired at the area with low accuracy of localization or at the area with high accuracy of localization to the pose graph.

AI technologies may be applied to the robot 1, and the robot 1 may be implemented as a guide robot, a transportation robot, a cleaning robot, a wearable robot, an entertainment robot, a pet robot, an unmanned aerial robot, and the like.

The robot 1 may include a robot control module for controlling operations, and the robot control module may denote a software module or a chip in which a software module is implemented as hard ware.

The robot 1 may acquire its state information, may detect (recognize) a surrounding environment and a surrounding object, may generate map data, may determine a moving path and a driving plan, may determine a response to user interaction or may determine an operation, using sensor information acquired from various types of sensors.

The robot 1 may use sensor information acquired by at least one or more sensors among a LiDAR sensor, a radar sensor, and a camera sensor to determine a moving path and a driving plan.

The robot 1 may perform the above-described operations using a learning model comprised of at least one or more artificial neural networks. For example, the robot 1 may recognize a surrounding environment and a surrounding object using the learning model, and may determine an operation using information on the recognized surrounding environment or object. The learning model may be directly learned by the robot 1 or by an external device such as an AI server 300 and the like.

In this case, the robot 1 may perform operations by directly using the learning model and generating results. The robot 1 may also perform operations by transmitting sensor information to an external device such as an AI server 300 and the like and by receiving results that are generated as a result.

The robot 1 may determine a moving path and a driving plan using at least one or more of map data, object information detected from sensor information, or object information acquired from an external device, and may drive on the basis of the determined moving path and driving plan by controlling a driving unit.

Map data may include object identification information on various objects in a space in which the robot 1 moves. For example, the map data may include object identification information on fixed objects such as a wall, a door and the like, and on movable objects such as a flower pot, a desk and the like. Additionally, the object identification information may include a name, a sort, a distance, a location and the like.

Further, the robot 1 may perform operations or may perform driving by controlling the driving unit on the basis of control/interactions of a user. In this case, the robot 1 may acquire intention information on interactions according to operations of the user or utterance of voices of the user, may determine responses on the basis of the acquired intention information, and may perform operations.

The controller 250 according to embodiments of the present disclosure may be equipped with an artificial intelligence module. In this case, the controller 250 may be equipped with an artificial intelligence module to search for a LiDAR frame similar to information acquired at a current position, among LiDAR frames stored in the map storage 210. For example, a deep learning network may be used to search an image, and the controller 250 including the deep learning network may increase the speed of a search for an image.

Also, using the wheel odometry information of driving unit, the controller 250 increases search speed by searching visual frame or LiDAR frame in map storage 210.

Although in embodiments, all the elements that constitute the embodiments of the present disclosure are described as being coupled to one or as being coupled to one so as to operate, the disclosure is not limited to the embodiments. One or more of all the elements may be optionally coupled to operate within the scope of the present disclosure. Additionally, each of the elements may be implemented as single independent hardware, or some or all of the elements may be optionally combined and implemented as a computer program that includes a program module for performing some or all of the combined functions in single hardware or a plurality of hardware. Codes or segments that constitute the computer program may be readily inferred by one having ordinary skill in the art. The computer program is recorded on computer-readable media and read and executed by a computer to implement the embodiments. Storage media that store computer programs includes storage media magnetic recording media, optical recording media, and semiconductor recording devices. Additionally, the computer program that embodies the embodiments includes a program module that is transmitted in real time through an external device.

The embodiments of the present disclosure have been described. However, the embodiments may be changed and modified in different forms by one having ordinary skill in the art. Thus, it should be understood that the changes and modifications are also included within the scope of the present disclosure

The invention claimed is:

1. A robot configured to update a map in fusion simultaneous localization and mapping (SLAM), the robot comprising;
    a moving unit configured to move the robot;
    a map storage configured to store a map of an area in which the robot moves,
    wherein the map has a double-layer structure, a first layer of the double-layer structure being a backbone and a second layer of the double-layer structure including a light detection and ranging (LiDAR) branch and a visual branch,
    wherein the backbone is information on a trajectory of the robot and includes one or more frame nodes corresponding to the trajectory,
    wherein the LiDAR branch comprises LiDAR frames with a LiDAR sensing value,
    wherein the visual branch comprises visual frames with a camera sensing value, and
    wherein at least one of the LiDAR frames is connected to the one or more frame nodes of the backbone, and at least one of the visual frames is connected to the one or more frame nodes of the backbone;
    a first sensor configured to acquire first type information required for the robot to perform SLAM;
    a second sensor configured to acquire second type information required for the robot to perform SLAM; and
    a controller configured to estimate a current position of the robot using a second map of a second type, to update a first map using the first type information with respect to the estimated position, and to store the updated first map in the map storage,
    wherein the controller comprises an artificial intelligent unit, and the controller is further configured to acquire information on an area with high accuracy of localization or an area with low accuracy of localization and provide the acquired information to the artificial intelligent unit;
    wherein the artificial intelligent unit is configured to compare the provided acquired information on the area with high accuracy of localization or the area with low accuracy of localization with information previously stored in the map storage, and determine whether to update the map,
    wherein when the LiDAR branch constitutes the first map, then the visual branch constitutes the second map, and
    wherein when the visual branch constitutes the first map, then the LiDAR branch constitutes the second map.

2. The robot of claim 1, wherein the first sensor is a LiDAR sensor and the second sensor is a camera sensor,
    the map storage stores a visual map that is the second map,
    the controller loads the visual map to estimate the current position of the robot, and
    the controller adds information, sensed by the LiDAR sensor with respect to the estimated position, to the first map.

3. The robot of claim 2, wherein the first map is any one of a LiDAR map stored in the map storage or a computer aided design (CAD) map comprised of CAD information.

4. The robot of claim 3, wherein the CAD map is map information in relation to building design.

5. The robot of claim 2, wherein the controller maintains information that constitutes the visual map to maintain an alignment between the visual map and the first map.

6. The robot of claim 1, wherein the first sensor is a camera sensor, and the second sensor is a light detection and ranging (LiDAR) sensor,
the map storage stores a LiDAR map that is the second map,
the controller loads the LiDAR map to estimate the current position of the robot, and
the controller adds information, sensed by the camera sensor with respect to the estimated position, to the first map.

7. The robot of claim 6, wherein the first map is any one of a visual map stored in the map storage or a computer aided design (CAD) map comprised of CAD information.

8. The robot of claim 6, wherein the controller maintains information that constitutes the LiDAR map to maintain an alignment between the LiDAR map and the first map.

9. The robot of claim 1, wherein the controller maintains the second map and optimizes pieces of added information of the first map.

10. The robot of claim 9, wherein the controller does not change a coordinate of a point of interest (POI) while maintaining the second map and optimizing the pieces of added information of the first map.

11. A method of updating a map in fusion simultaneous localization and mapping (SLAM), the method comprising:
controlling, by a controller of a robot, the robot to move;
based on movement of the robot, storing, by the controller of the robot, a map having a double-layer structure, a first layer of the double-layer structure being a backbone and a second layer of the double-layer structure including a light detection and ranging (LiDAR) branch and a visual branch,
wherein the backbone is information on a trajectory of the robot and includes one or more frame nodes corresponding to the trajectory,
wherein the LiDAR branch comprises LiDAR frames with a LIDAR sensing value,
wherein the visual branch comprises visual frames with a camera sensing value, and
wherein at least one of the LiDAR frames is connected to the one or more frame nodes of the backbone, and at least one of the visual frames is connected to the one or more frame nodes of the backbone;
acquiring, by a first sensor of the robot, first type information;
acquiring, by a second sensor of the robot, second type information;
estimating, by the controller of the robot, a current position of the robot using a second map of a second type stored in a map storage of the robot;
updating, by the controller, a first map using the first type information with respect to the estimated position; and
storing, by the controller, the updated first map in the map storage,
wherein the controller comprises an artificial intelligent unit, and the controller is configured to acquire information on an area with high accuracy of localization or an area with low accuracy of localization and provide the acquired information to the artificial intelligent unit;
wherein the artificial intelligent unit is configured to compare the provided acquired information on the area with high accuracy of localization or the area with low accuracy of localization with information previously stored in the map storage, and determine whether to update the map;
wherein when the LiDAR branch constitutes the first map, then the visual branch constitutes the second map; and
wherein when the visual branch constitutes the first map, then the LiDAR branch constitutes the second map.

12. The method of claim 11, wherein the first sensor is a LiDAR sensor and the second sensor is a camera sensor,
wherein the map storage stores a visual map that is the second map, and
wherein the method further comprises:
loading, by the controller, the visual map to estimate the current position of the robot; and
adding, by the controller, information, sensed by the LiDAR sensor with respect to the estimated position, to the first map.

13. The method of claim 12, wherein the first map is any one of a LiDAR map stored in the map storage or a computer aided design (CAD) map comprised of CAD information.

14. The method of claim 13, wherein the CAD map is map information in relation to building design.

15. The method of claim 12, further comprising:
maintaining, by the controller, information that constitutes the visual map to maintain an alignment between the visual map and the first map.

16. The method of claim 9, wherein the first sensor is a camera sensor and the second sensor is a light detection and ranging (LiDAR) sensor,
wherein the map storage stores a LiDAR map that is the second map, and
wherein the method further comprises:
loading, by the controller, the LiDAR map to estimate the current position of the robot; and
adding, by the controller, information, sensed by the camera sensor with respect to the estimated position, to the first map.

17. The method of claim 16, wherein the first map is any one of a visual map stored in the map storage or a computer aided design (CAD) map comprised of CAD information.

18. The method of claim 16, further comprising:
maintaining, by the controller, information that constitutes the LiDAR map to maintain an alignment between the LiDAR map and the first map.

19. The method of claim 11, further comprising:
maintaining, by the controller, the second map and optimizing pieces of added information of the first map.

20. The method of claim 19, wherein the controller does not change a coordinate of a point of interest (POI) while maintaining the second map and optimizing the pieces of added information of the first map.

* * * * *